United States Patent [19]

Matievic

[11] Patent Number: 4,626,799

[45] Date of Patent: Dec. 2, 1986

[54] WARBLE SIGNALING DEVICE

[75] Inventor: Miroslav Matievic, Indianapolis, Ind.

[73] Assignee: Emhart Industries, Inc., Indianapolis, Ind.

[21] Appl. No.: 779,263

[22] Filed: Sep. 23, 1985

[51] Int. Cl.[4] .......................... G08B 3/10; H03B 5/24; H03K 3/03

[52] U.S. Cl. ........................................ 331/47; 331/49; 331/52; 331/55; 331/111; 331/108 D; 331/153; 331/DIG. 3; 340/384 E

[58] Field of Search .................................... 331/46-50, 331/52, 55, 56, 111, 108 D, 143, 145, 153, DIG. 3; 340/384 E

[56] References Cited

U.S. PATENT DOCUMENTS

| | | | |
|---|---|---|---|
| 3,416,065 | 12/1968 | Redfern | 321/61 |
| 4,193,060 | 3/1980 | Slavin | 340/52 D |
| 4,558,305 | 12/1985 | Black et al. | 340/384 E |

OTHER PUBLICATIONS

Plummer, "Oscillators Using TTL Schmitt Trigger Gates", New Electronics, vol. 13, No. 17, 2 Sep. 1980, p. 34.

Button, "Two Tone Burst Generator Has Nanoamp Standby Current", Electronic Product Design, Jul. 1981, p. 29.

Ritchie, "PIP Generator", Practical Electronics, vol. 17, No. 3, p. 62.

Hee-haw Siren for Toy Cars, by Gerald Cohn, Electronics, Australia, Jun. 1980, pp. 77, 79.

*Primary Examiner*—Siegfried H. Grimm

*Attorney, Agent, or Firm*—Robert F. Meyer; Carl A. Forest

[57] ABSTRACT

There are three oscillator circuits which oscillate at different frequencies, each oscillator circuit including a gate having an input and an output. The output of the first gate is connected to an inverter and the input of the second gate. The output of the inverter is connected to the input of the third gate. The output of the second and third gates is connected across a piezoelectric transducer to produce a warble sound.

2 Claims, 1 Drawing Figure

WARBLE SIGNALING DEVICE

BACKGROUND OF THE INVENTION

1. Field of the Invention.

The invention in general relates to audio tone signaling devices having piezoelectric transducers and which produce a warble sound signal, and more particularly to such a signaling device which is simple and inexpensive to manufacture.

2. Description of the Prior Art.

Audio tone signaling devices are widely used for applications such as to signal the existence of a condition, the end of an operating cycle, the end of a period of time, or a reminder of something. Because humans can become accustomed to and ignore steady, single-frequency sounds, signal devices which warble or alternate between two frequencies have become common, particularly in alarms. With the proliferation of electronic and other systems which employ alarms and other signaling devices, and the systematic and steady miniaturization and decrease in cost of such systems, it has become important that the alarms and other signaling devices used for such systems be both small and inexpensive so that they do not unduly contribute to the overall size and cost of the system.

SUMMARY OF THE INVENTION

It is an object of the invention to provide the simplest and least expensive warble alarm possible.

It is another object of the invention to provide the above object in a warble oscillator that is reliable and can withstand shock and abuse.

The invention provides a warble signaling device comprising a first oscillator means for oscillating at a first frequency, the first oscillator means including a first gate having at least one active input and an output, a second oscillator means for oscillating at a second frqurency different from the first frequency, the second oscillator means including a second gate having at least two active inputs and an output, a third oscillator means oscillating at a third frequency different from the first and second frequencies, said third oscillator means including a third gate having at least two active inputs and an output, an inverter having one input and an output, and a piezoelectric transducer. The output of the first gate is connected to the input of the inverter and to one input of the second gate, the output of the inverter is connected to one input of the third gate, and the outputs of the second and third gates are connected across the piezoelectric transducer. Preferably the gates are Schmitt trigger gates.

The warble signaling device according to the invention can be manufactured employing only a d.c. power source (such as a battery) a single, inexpensive, commercially available I.C. chip, and the transducer at a cost significantly lower than the cost of the simplest prior art warble signaling devices.

Other features, objects and advantages of the invention will become apparent from the following detailed description when read in conjunction with the accompanying drawings.

DESCRIPTION OF THE PREFERRED EMBODIMENT

Figure 1:
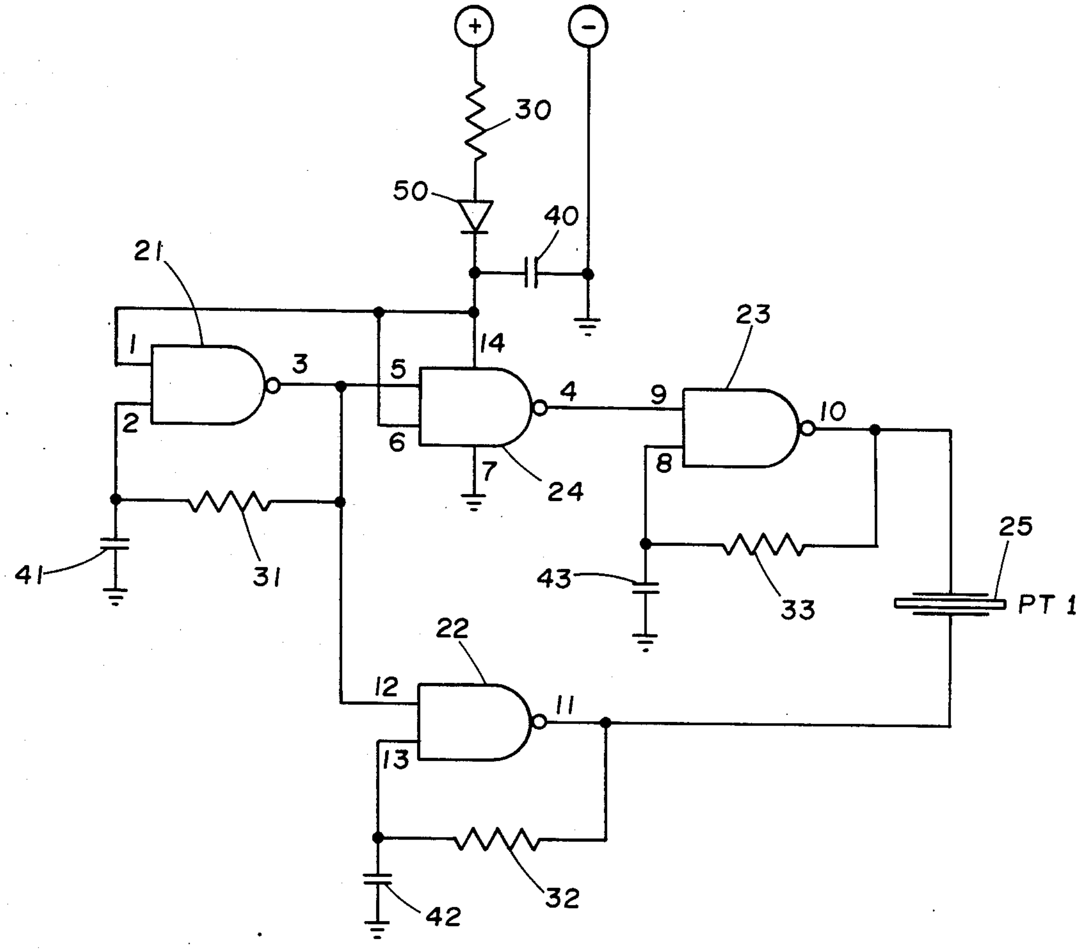
FIG. 1 is a detailed electric circuit diagram showing the preferred embodiment of a warble signaling device according to the invention.

Directing attention to FIG. 1, a detailed electric circuit diagram of the preferred embodiment of the invention is shown. This embodiment includes two gates 22 and 23 which are wired as oscillators to alternatively drive a piezoelectric transducer 25 and another gate 21, which is also wired as an oscillator and operates to "warble" or switch between the two driving oscillators 22 and 23. There is also a fourth gate 24 which is wired as an inverter.

Focusing now on a more detailed description of the circuitry of FIG. 1, the preferred embodiment of the invention comprises NAND gates 21, 22, 23 and 24, resistors 30, 31, 32 and 33, capacitors 40, 41, 42 and 43, and diode 50. In the preferred embodiment, the NAND gates 21 through 24 are part of a quadruple two input NAND Schmitt trigger integrated circuit type CD4093 or similar circuit. The pin numbers referred to below and in the drawings are the pin numbers for this integrated circuit. The gates 21, 22 and 23 each have two active inputs and an output. By "active" is meant an input that has a controlling function other than simply the provision of power (such as the #14 and #7 input pins of inverter 24 which would be inactive inputs).

The circuit of FIG. 1 may be powered by a variety of conventional d.c. power sources connected across the terminals marked +and −. Preferably the power source is a four to fifteen volt battery. The anode of diode 50 is connected to the positive voltage terminal through resistor 30. The cathode of diode 50 is connected to the negative voltage terminal and the system ground through capacitor 40, and also to one input (pin 1) of the first oscillator-gate 21, one input (pin 6) of the inverter-gate and pin 14 of the integrated circuit. The current limiting resistor 30 with diode 50 (used for polarity protection) and filter capacitor 40 together make a power conditioning circuit. The other input (pin 2) of the first oscillator-gate 21 is connected to ground through capacitor 41 and to the output (pin 3) of the gate through resistor 31. The output (pin 3) of the first gate is connected to one input (pin 5) of the integrated circuit and one input (pin 12) of the second oscillator-gate 22. The other input (pin 13) of the second gate 22 is connected to ground through capacitor 42 ano to its own output (pin 11) through resistor 32. Pin 7 of the integrated circuit is grounded. The output (pin 4) of inverter 24 is applied to one input (pin 9) of the third oscillator-gate 23. The other input (pin 8) of the third gate 23 is connected to ground through capacitor 43 and to its own output (pin 10) through resistor 33. The outputs of the second oscillator gate 22 and the third oscillator gate 23 are connected across piezoelectric transducer 25.

Gates 21, 22, and 23 are used as amplifiers in their oscillator circuits. Gate 21, capacitor 41, and resistor 31 together comprise a means for oscillating the output signal of the first oscillator-gate 21 and are chosen to produce the desired warble frequency which, in the preferred embodiment, is about 2 Hz. Gate 22, capacitor 42, and resistor 32 together comprise a means for oscillating the output signal of the second oscillator-gate 22 and are chosen to produce the higher tone frequency which, in the preferred embodiment, is about 3kHz.

Gate 23, capacitor 43, and resistor 33 together form a means for oscillating the signal output by the third oscillator-gate 23 and are chosen to produce a lower tone frequency which, in the preferred embodiment, is about 1.8 kHz. Resistor 30, capacitor 40, and diode 50 are chosen as is known in the art to properly condition the power for the desired operating voltage. Piezoelectric transducer 25 is preferably a force driven crystal assembled in an appropriate housing to give high sound output at both the high and low tone frequencies.

The invention operates as follows: a voltage applied to the device causes the first oscillator-gate 21 output to oscillate between the low and high voltage levels at a frequency of, for example, 2 Hz. When the output of gate 21 is high, the output of inverter 24 and one input (pin 9) to the third oscillator-gate 23 is low, thus the output (pin 10) of the gate and the other input is high, which is a stable condition so the gate does not oscillate. However, the input (pin 12) of the second oscillator-gate 22 will be high which will allow the circuit to oscillate between the high and low voltage states at a frequency of, for example, 3 kHz, which drives the piezoelectric transducer 25 at the same frequency. (Note that power is applied to the transducer 25 when the output of gate 22 is in the low part of the cycle.) When the output of gate 21 is low, one input (pin 12) to gate 22 is low and its output (pin 11) and other input (pin 13) is high which is a stable condition and it does not oscillate. The output of inverter 24 will be high which will cause oscillator 23 to oscillate at, for example, 1.8 kHZ, driving piezoelectric transducer 25 at the same rate. Thus the transducer 25 will oscillate alternatively at 3 kHZ and 1.8 kHz at about ½ second intervals producing a warble sound.

It is a feature of the invention that the entire oscillator circuitry can be constructed with a single simple and common I.C. circuit and the resistors and capacitors which determine the oscillating frequencies. The signaling device according to the invention is a rugged, compact unit that can be used for many applications.

A novel, inexpensive warble signaling device has been described. It is evident that those skilled in the art may now make many uses and modifications of the specific embodiment described without departing from the inventive concepts. For example, an off/on switch could be placed at some point between the power source and pin 1 of gate 21. Other equivalent electronic parts may be used. Additional features may be added. Consequently, the invention is to be construed as embracing each and every novel feature and novel combination of features present in the warble signaling device described.

What is claimed is:

1. A warble signaling device comprising:

a first oscillator means for oscillating at a first frequency, said first oscillator means including a first gate having at least one active input and an output;

a second oscillator means for oscillating at a second frequency different from said first frequency, said second oscillator means including a second gate having at least two active, inputs and an output;

a third oscillator means for oscillating at a third frequency different from said first and second frequencies, said third oscillator means including a third gate having at least two active inputs and an output;

an inverter having an input and an output;

a piezoelectric transducer;

said output of said first gate connected to the input of said inverter and to one input of said second gate;

said output of said inverter connected to one input of said third gate; and the outputs of said second and third gates connected across said piezoelectric transducer.

2. The warble signaling device of claim 1 wherein said gates are Schmitt trigger gates.

* * * * *